United States Patent [19]

Kondo

[11] Patent Number: 5,515,322
[45] Date of Patent: May 7, 1996

[54] SEMICONDUCTOR MEMORY DEVICE EQUIPPED WITH SENSE AMPLIFIERS SELECTIVELY ACTIVATED WITH COLUMN ADDRESS DECODED SIGNALS

[75] Inventor: Ichirou Kondo, Tokyo, Japan

[73] Assignee: NEC Corporation, Tokyo, Japan

[21] Appl. No.: 280,845

[22] Filed: Jul. 26, 1994

[30] Foreign Application Priority Data

Jul. 26, 1993 [JP] Japan .................................... 5-184113

[51] Int. Cl.$^6$ .................................................. G11C 11/34
[52] U.S. Cl. ................................... 365/185.21; 365/207
[58] Field of Search ........................... 365/205, 207, 365/189.08, 230.03, 203, 185.21, 185.11

[56] References Cited

U.S. PATENT DOCUMENTS

| 4,903,235 | 2/1990 | Kubota | 365/205 |
|---|---|---|---|
| 5,258,959 | 11/1993 | Dallabora | 365/203 |
| 5,291,447 | 3/1994 | Kodama | 365/207 |
| 5,321,699 | 6/1994 | Endoh | 365/185 |

FOREIGN PATENT DOCUMENTS 63-119098  5/1988  Japan .

*Primary Examiner*—David C. Nelms
*Assistant Examiner*—A. Zarabian
*Attorney, Agent, or Firm*—Sughrue, Mion, Zinn, Macpeak & Seas

[57] ABSTRACT

Sense amplifier circuits incorporated in a semiconductor read only memory device are equipped with respective clocked logic circuits selectively activated with column address decoded signals, and independently discriminate the potential levels on the digit lines so that the discrimination is rapid without a malfunction.

10 Claims, 9 Drawing Sheets

SEMICONDUCTOR MEMORY DEVICE EQUIPPED WITH SENSE AMPLIFIERS SELECTIVELY ACTIVATED WITH COLUMN ADDRESS DECODED SIGNALS

FIELD OF THE INVENTION

This invention relates to a semiconductor memory device and, more particularly, to a semiconductor memory device operable under a low power voltage at a high speed.

DESCRIPTION OF THE RELATED ART

A typical example of the semiconductor memory device is disclosed in Japanese Patent Publication of Unexamined Application No. 63-119098, and the prior art semiconductor memory device is illustrated in FIG. 1 of the drawings. The prior art semiconductor memory device comprises a plurality of memory cell blocks 1a, 1b, 1c and 1d, and all of the memory cell blocks 1a to 1d are similar in arrangement to one another. For this reason, description is focused on the memory cell block 1a only.

Each of the memory cell blocks 1a to 1d comprises an array of read-only memory cells for non-rewritably storing data bits, a plurality of row lines 2a, 2b, 2c and 2d and a plurality of column lines 3a, 3b, 3c and 3d, and the read-only memory cells are placed at predetermined locations selected from the crossing points between the plurality of row lines 2a to 2d and the plurality of column lines 3a to 3d. Each of the read-only memory cells is implemented by an enhancement type MOS transistor coupled between the column lines 3a to 3d and a constant voltage source, and the row lines 3a to 3d are selectively energized so that the associated enhancement type MOS transistors turn on.

The memory cell block 1a further comprises a discharging circuit 4 implemented by a parallel combination of n-channel enhancement type MOS transistors 4a, 4b, 4c and 4d, and the n-channel enhancement type MOS transistors 4a to 4d are respectively coupled at the drain nodes thereof to the column lines 3a to 3d and at the source nodes thereof to a ground voltage line Vss. A discharge control signal DLSROM is supplied to the gate electrodes of the n-channel enhancement type MOS transistors 4a to 4d, and causes the n-channel enhancement type MOS transistors 4a to 4d to discharge the associated column lines 3a to 3d, respectively.

The memory cell block 1a further comprises a column selector circuit 5 implemented by a parallel combination of p-channel enhancement type MOS transistors 5a, 5b, 5c and 5d coupled at the source nodes thereof to a power voltage line Vcc and at the drain nodes thereof to the respective column lines 3a to 3d. Column selecting signals NCOLDEC0, NCOLDEC1, NCOLDEC2 and NCOLDEC3 are respectively supplied to the gate electrodes of the p-channel enhancement type MOS transistors 5a to 5d, and selectively allow the p-channel enhancement type MOS transistors 5a to 5d to charge the column lines 3a to 3d.

The memory cell block 6 further comprises a sense amplifier circuit 6, and the sense amplifier circuit 6 is implemented by a series combination of p-channel enhancement type MOS transistors 6a, 6b, 6c, 6d and 6e and an n-channel enhancement type MOS transistor 6f coupled between the power voltage line Vcc and the ground voltage line Vss. An activation signal OE1 is supplied to the gate electrode of the p-channel enhancement type MOS transistor 6a and the gate electrode of the n-channel enhancement MOS transistor 6f, and the other p-channel enhancement type MOS transistors 6b to 6e are respectively gated by the column lines 3a to 3d. An accessed data bit takes place at an output node N1 of the sense amplifier 6 in the form of either high or low voltage level.

The prior art semiconductor memory device further comprises a shared sense amplifier circuit 7 for all of the memory cell blocks 1a to 1d, and the shared sense amplifier circuit 7 is implemented by a series combination of a p-channel enhancement type MOS transistor 7a and n-channel enhancement type MOS transistors 7b, 7c, 7d, 7e and 7f coupled between the power voltage line Vcc and the ground voltage line Vss. An activation signal OE2 is supplied to the gate electrode of the p-channel enhancement type MOS transistor 7a and the gate electrode of the n-channel enhancement type MOS transistor 7f, and the other n-channel enhancement type MOS transistors 7b to 7e are respectively gated by the output nodes N1 of the memory cell blocks 1a to 1d. The accessed data bit takes place at an output node N2 also in the form of either high or low voltage level.

The prior art semiconductor memory device further comprises an output circuit 8, and the output circuit 8 has a NOR gate NR1 and an n-channel enhancement type MOS transistor 8a. The NOR gate NR1 is enabled with an output enable signal NH4, and is responsive to the accessed data bit at the output node N2 so as to gate the n-channel enhancement type MOS transistor 8a. The n-channel enhancement type MOS transistor 8a is coupled between a precharged node N3 and the ground voltage line Vss, and an output data signal indicative of the accessed data bit is supplied from the precharged node N3.

The prior art semiconductor memory device thus arranged behaves as follows. FIG. 2 illustrates an access to a data bit of logic "0" level corresponding to the low voltage level stored in the memory cell located at the crossing point between the column line 3c and the row line 2b.

First, the discharging signal DISROM is changed to the active high voltage level at time t1, and all of the n-channel enhancement type MOS transistors 4a to 4d turn on for discharging the associated column lines 3a to 3d. As a result, all of the column lines 3a to 3d are decayed to the ground voltage level.

Subsequently, the column selecting signal NCOLDEC2 is changed to the active low voltage level at time t2, and the other column selecting signals NCOLDEC0, NCOLDEC1 and NCOLDEC3 are maintained in the inactive high voltage level. For this reason, only the column line 3c is changed to the high voltage level, and the other column lines 3a, 3b and 3d are maintained in the low voltage level.

The column selecting signal NCOLDEC2 is recovered from the active low voltage level to the inactive high voltage level at time t3, and all of the column lines 3a to 3d enter into floating state.

The row line 2b is changed to the active high voltage level at time t4 to see whether or not memory cells are provided at the crossing points on the row line 2b. The memory cell has been provided at the crossing point between the row line 2b and the column line 3c, and the memory cell provides a conductive channel between the associated column line 3c and the ground voltage line Vss. For this reason, the charged column line 3c is discharged, and is decayed toward the low voltage level.

At time t4, the activating signal OE1 is still maintained at the high voltage level, and the n-channel enhancement type MOS transistor 6f is turned on. However, the p-channel enhancement type MOS transistor 6a is turned off.

The activating signal OE1 is changed to the low voltage level between time t4 and t5, and the conductive channel is created in the p-channel enhancement type MOS transistor 6a. Since all of the column lines 3a to 3d have already discharged, the p-channel enhancement type MOS transistors 6b to 6e transfer the high voltage level to the output node N1, and the output node N1 is charged through the p-channel enhancement type MOS transistors 6a to 6e toward the high voltage level.

While a data bit stored in the memory cell block is being accessed, all of the column lines of the other memory cell blocks 1b to 1d are not precharged, and the output nodes N1 of the other memory cell blocks 1b to 1d are maintained at the high voltage level.

The activating signal OE2 is maintained at the low voltage level before time t5, and the p-channel enhancement type MOS transistor 7a is turned on. The activating signal OE2 maintains the n-channel enhancement type MOS transistor 7f in off state, and the output node N2 is charged to the high voltage level. The output nodes N1 of the memory cell blocks 1a to 1d allow the n-channel enhancement type MOS transistors 7b to 7e to turn on. However, the output node N2 is isolated from the ground voltage line Vss by the n-channel enhancement type MOS transistor 7f.

The activating signal OE2 is changed to the high voltage level at time t5, and the p-channel enhancement type MOS transistor 7a turns off for isolating the output node N2 from the power voltage line Vcc. On the other hand, the n-channel enhancement type MOS transistor 7f turns on, and the output node N2 is discharged through the MOS transistors 7b to 7f to the ground voltage line. As a result, the output node N2 is changed to the low voltage level.

If the output enable signal NH4 is changed to the low voltage level or logic " 0" level at time t6, the NOR gate NR1 is enabled, and becomes responsive to the voltage level at the output node N2. The output node N2 has been already discharged, and the NOR gate NR1 yields logic "1" level or the high voltage level. The n-channel enhancement type MOS transistor 8a turns on, and the precharged node N3 is discharged. As a result, the output data signal is changed to the low voltage level or logic " 0" level indicative of the accessed data bit.

If the row line 2a is selected instead of the row line 2b, the column line 3c is maintained at the high voltage level, and the p-channel enhancement type MOS transistor 6d never turns on. For this reason, the output node N1 is maintained in the low voltage level, and the n-channel enhancement type MOS transistor 7b blocks the output node N2 from the ground voltage line Vss. The NOR gate NR1 yield logic " 0" level or the low voltage level, and the n-channel enhancement type MOS transistor 8a isolates the precharged node N3 from the ground voltage line Vss. As a result, the output data signal is changed to the high voltage level or logic "1" level indicative of the accessed data bit.

Thus, the prior art semiconductor memory device discriminates the potential level of the accessed data bit by using two stages of sense amplifiers 6 and 7.

However, a problem is encountered in the prior art sense amplifier circuit 6 in that relatively long time period is consumed for discriminating the potential level of the accessed data bit. This is because of the fact that the p-channel enhancement type MOS transistors 6a to 6e sequentially propagate the power voltage level Vcc to the output node N1. Thus, the propagation introduces time delay, and does not allow an external device to access data bits at high speed.

Another problem inherent in the prior art semiconductor memory device is an undesirable inversion of the accessed data bit. The reason why the malfunction takes place is that the p-channel enhancement type MOS transistors 6a to 6e sequentially steps down the power voltage level, and the undesirable step-down decreases a margin between the threshold of the p-channel enhancement type MOS transistors and an actual difference between the voltage level at the source node and the voltage level at the gate electrode. If one of the p-channel enhancement type MOS transistors has a relatively small threshold due for example, a back gate voltage variable in position, the p-channel enhancement type MOS transistor is undesirably turned off, and the voltage level at the output node N1 does not correctly represent the logic level of the accessed data bit.

SUMMARY OF THE INVENTION

It is therefore an important object of the present invention to provide a semiconductor memory device which has sense amplifier circuits discriminating the potential level at high speed without a malfunction.

To accomplish the object, the present invention proposes to selectively activate a plurality of sense amplifier circuits for selecting one of read-out data bits.

In accordance with the present invention, there is provided a semiconductor memory device fabricated on a single semiconductor chip, comprising: a) a plurality of addressable memory locations respectively storing data bits readable in the form of potential level; b) a first addressing system operative to select memory locations from the plurality of addressable memory locations for reading out the data bits therefrom; c) a plurality of data propagation paths selectively coupled to the plurality of addressable memory cells, and propagating the data bits read out from the memory locations; d) a second addressing system selectively energizing a plurality of selecting signal lines for selecting one of the data bits on the plurality of data propagation paths; e) a plurality of sense amplifiers coupled to the plurality of data propagation paths, respectively, and selectively activated with the plurality of selecting signal lines for rapidly discriminating the potential level of the aforesaid one of the data bits; and f) an output circuit for delivering the aforesaid one of the data bits to the outside thereof.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
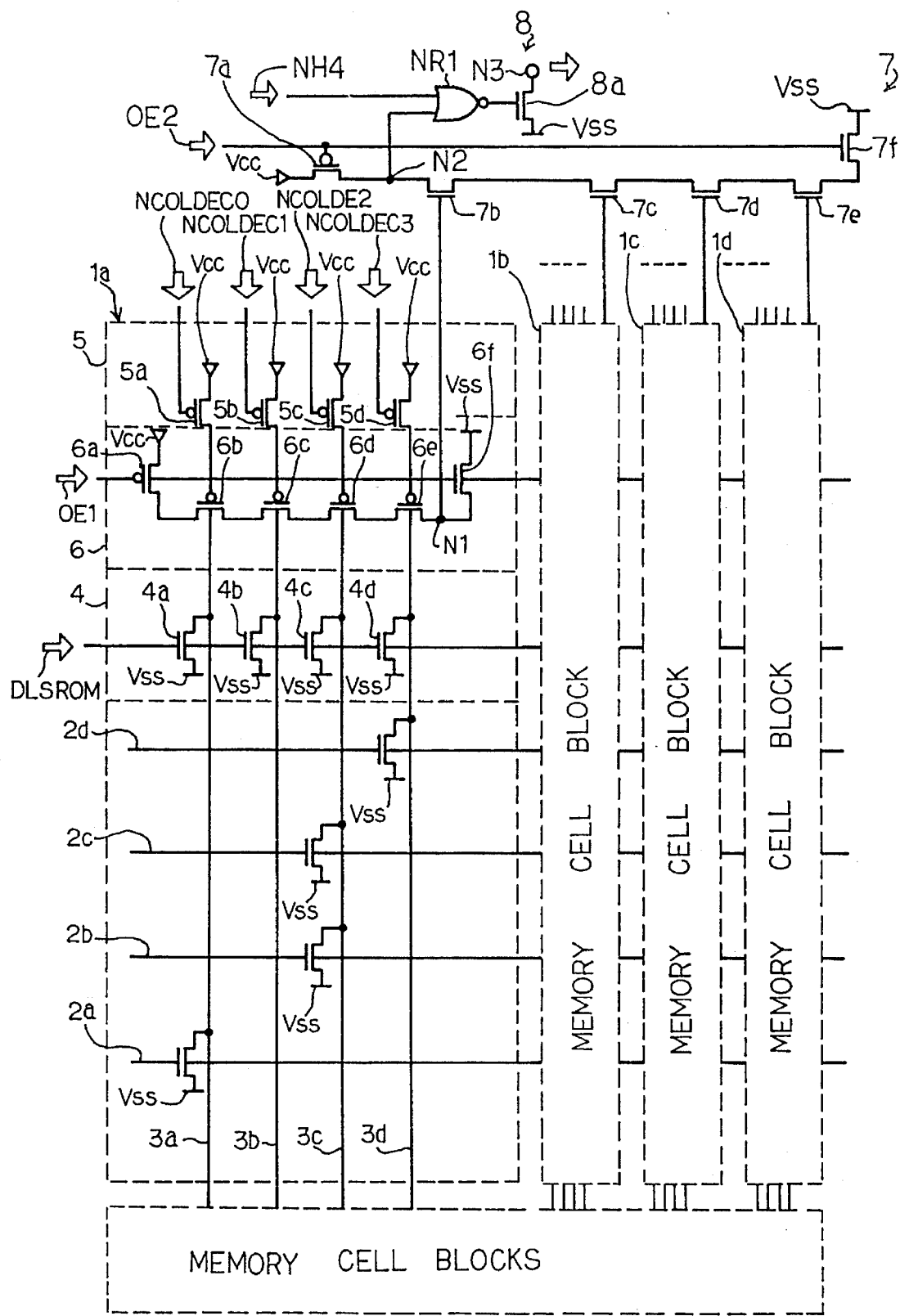
FIG. 1 is a circuit diagram showing the arrangement of the prior art semiconductor memory device.
Figure 2:
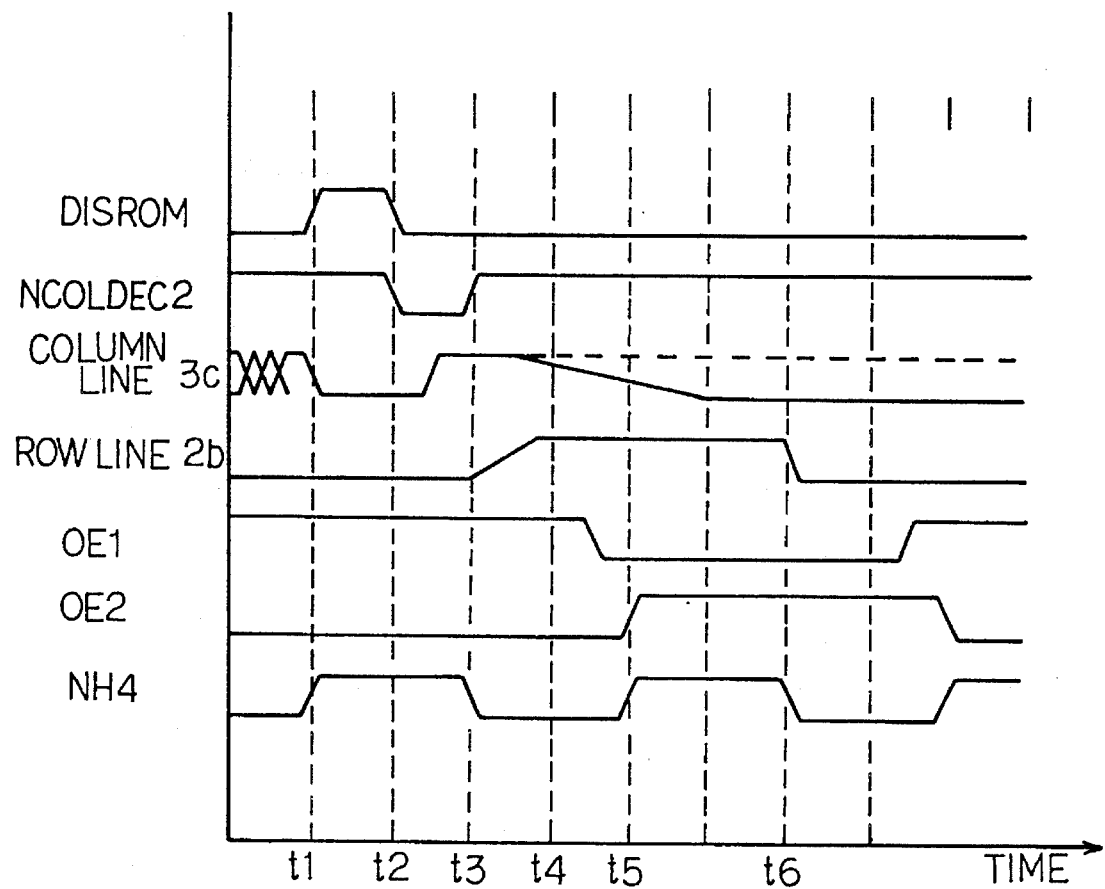
FIG. 2 is a timing chart showing the data access to the data bit stored in the memory cell block incorporated in the prior art semiconductor memory device.
Figure 3:
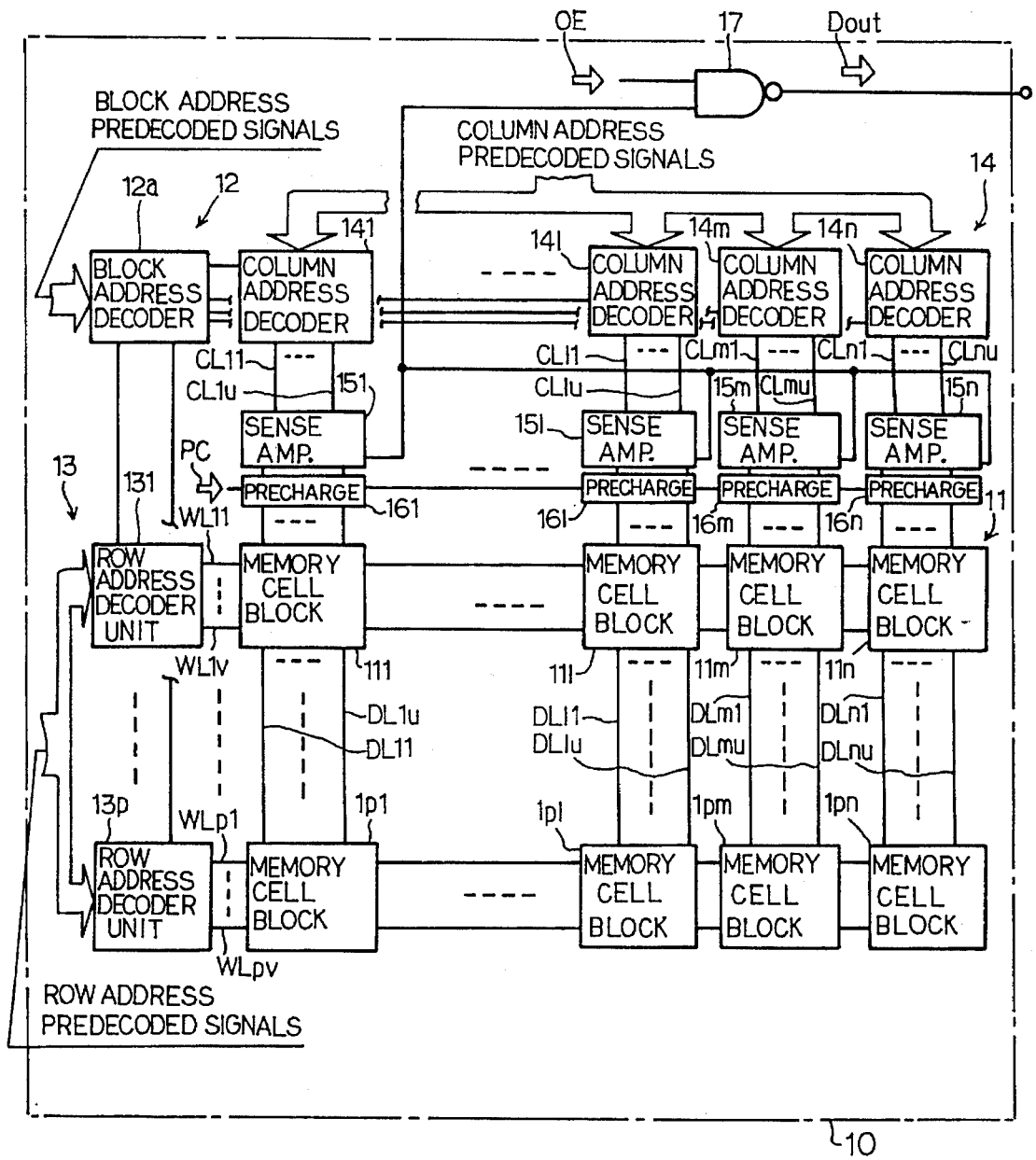
FIG. 3 is a block diagram showing the arrangement of a semiconductor read only memory device according to the present invention.

Referring first to FIG. 3 of the drawings, a semiconductor read only memory device embodying the present invention is fabricated on a semiconductor chip 10, and largely comprises a memory cell array 11, a block addressing system 12, a row addressing system 13, a column addressing system 14, a plurality of sense amplifier units 151, ..., 15n, a plurality of precharging circuits 161, ... 16l, 16m and 16n and an output unit 17. An external device (not shown) accesses data information stored in the memory cell array 11 with external address bits, and the external address bits are predecoded for producing block address predecoded signals, row address predecoded signals and column address predecoded signals.

The memory cell array 11 is broken down into a plurality of memory cell blocks 111, ... 11l, 11m, 11n, ..., 1p1, 1pl, 1pm and 1pn, and the plurality of memory cell blocks 111 to 1pn are arranged in rows and columns. A block row address and a block column address are assigned to each of the memory cell blocks 111 to 1pn, and the block addressing system 12 makes one of the memory cell blocks 111 to 1pn accessible.

A plurality of sets of digit lines DL11–DL1u, ... DLl1–DLlu, DLm1–DLmu and DLn1–DLnu are respectively associated with the columns of memory cell blocks 111 to 1pn, and a selected set of digit lines propagate data bits to the associated sense amplifier unit.

A plurality of sets of word lines WL11–WL1v to WLp1–WLpv are respectively associated with the rows of memory cell blocks 111 to 1pn, and the word lines of a selected set is selectively changed to an active high voltage level. Thus, the selected set of word lines and the selected set of digit lines make one of the memory cell blocks 111 to 1pn accessible.

The block address decoding system 12 is implemented by a block address decoder 12a and associated signal lines, and the block address decoder 12a is responsive to the block address predecoded signals for selecting one of the memory cell blocks 111 to 1pn through the row addressing system 13 and the column addressing system 14.

The row addressing system comprises a plurality of row address decoders 131 to 13p, and the plurality of row address docoders 131 to 13p are respectively associated with the plurality of sets of word lines WL11–WL1v to WLp1–WLpv. The block address decoder 12a enables one of the row address decoder units 131 to 13p, and the enabled row address decoder unit becomes responsive to the row address predecoded signals for driving one of the associated word lines to the active high voltage level.

The column addressing system 14 is implemented by a plurality of column address decoders 141, ... 14l, 14m and 14n associated with sets of column address decoded lines CL11–CL1u, ... CLl1–CLlw, CLm1–CLmu and CLn1–CLnu, respectively, and one of the column address decoders 141 to 14n is enabled by the block address decoder 12a. The enabled column address decoder becomes responsive to the column address predecoded signals for driving one of the associated column address decoded lines.

The sense amplifier units 151 to 15n are respectively associated with the plurality sets of digit lines DL11–DL1u to DLn1–DLnu, and the sense amplifier unit associated with the enabled column address decoder amplifies a read-out data signal indicative of an accessed data bit.

The precharging circuits 161 to 16n are respectively associated with the plurality of sets of digit lines DL11–DL1u to DLn1–DLnu, and are responsive to a precharge control signal PC for charging the associated sets of digit lines DL11–DL1u to DLn1–DLnu to a power voltage level Vcc. A selected word line causes the associated row of memory cell blocks to change the voltage levels on the sets of digit lines DL11–DL1u to DLn1–DLnu, and one of the sense amplifier units 151 to 15n rapidly discriminates the voltage level on the selected digit line indicative of the accessed data bit. The sense amplifier reports the discriminated voltage level to the output circuit 17 implemented by an NAND gate, and an output enable signal OE allows the NAND gate to produce an output data signal Dout indicative of the accessed data bit.

Figure 4:
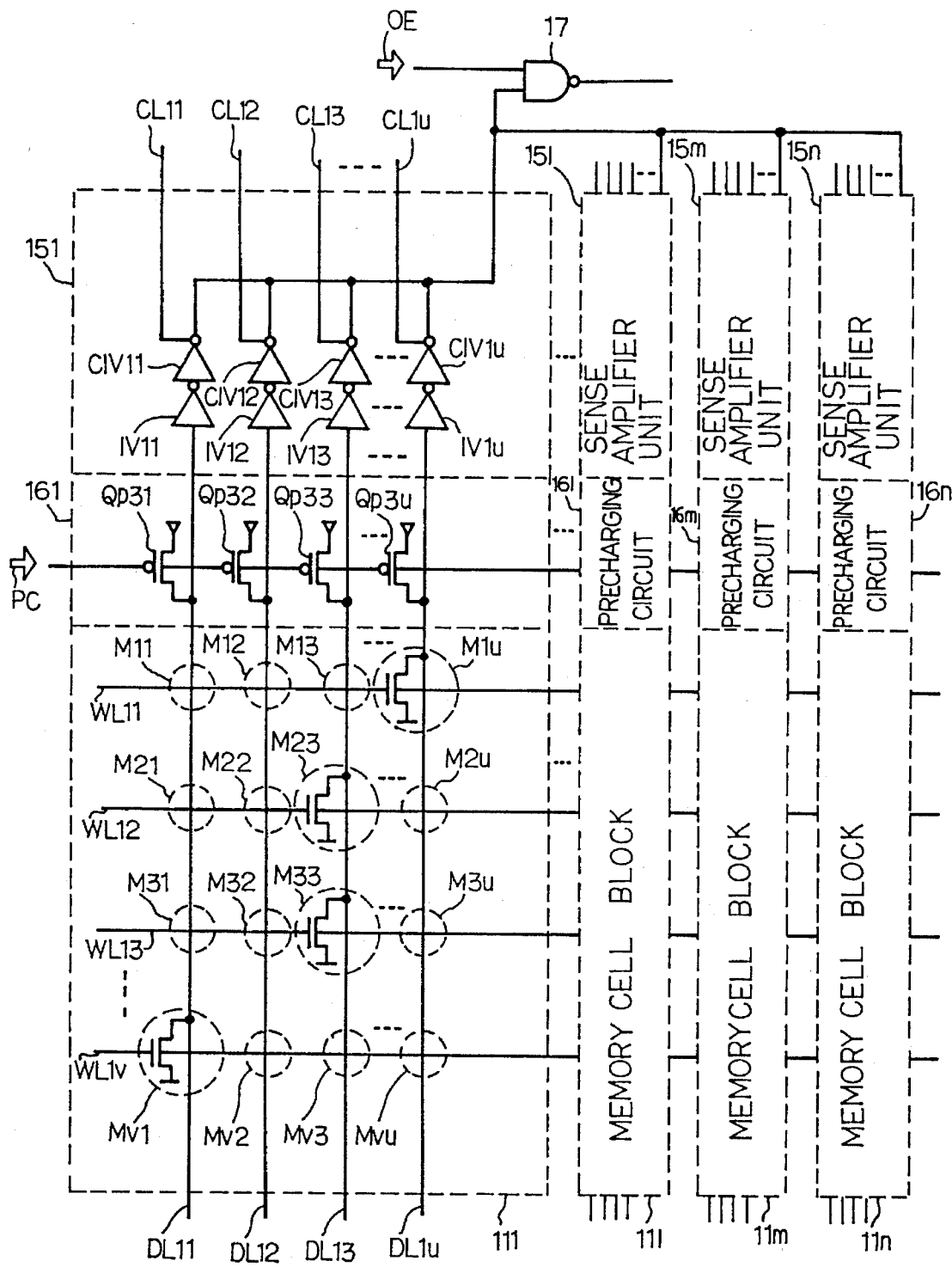
FIG. 4 is a circuit diagram showing the arrangement of a semiconductor read only memory device according to the present invention.

Turning to FIG. 4 of the drawings, the memory cell block 111, the sense amplifier unit 151 and the precharging circuit 161 are illustrated in detail, and the other memory cell blocks 11l to 1pn, the other sense amplifier units 15l to 15n and the other precharging circuits 16l to 16n are analogous to the memory cell block 111, the sense amplifier unit 151 and the precharging circuit 161, respectively. For this reason, description is focused on the memory cell block 111, the sense amplifier unit 151 and the precharging circuit 161.

The memory cell block 111 has a plurality of memory locations M11, M12, M13, ... M1u, M21, M22, M23, ... M2u, M31, M32, M33, ... M3u, Mv1, Mv2, Mv3 ... and Mvu for storing data bits, respectively, and circles drawn by broken lines are indicative of the memory locations M11 to Mvu, respectively. In this instance, a data bit of logic "1" is represented by an n-channel enhancement type field effect transistor with a lower threshold rather than the active high voltage level on the associated word line, and a data bit of logic " 0" is represented by an n-channel enhancement type field effect transistor with a higher threshold rather than the active high voltage level . The n-channel enhancement type field effect transistor with the higher threshold is not shown in FIG. 4, and the data bits may be stored by selectively carrying out a channel doping. In another implementation, diodes may form the memory locations. In this instance, the diodes are selectively broken so as to isolate the associated digit lines from the ground voltage line.

The columns of memory locations M11 to Mvu are respectively associated with the digit lines DL11, DL12, DL13, ... and DL1u, and the drain nodes of the n-channel enhancement type field effect transistors are coupled to the associated digit lines DL11 to DL1u, respectively. The source nodes of the n-channel enhancement type field effect transistors M11 to Mvu are coupled with a ground voltage line.

The rows of memory locations M11 to Mvu are respectively associated with the word lines WL11, WL12, WL13, ... and WL1v, and the gate electrodes of the n-channel enhancement type field effect transistors are coupled with the associated word lines WL11 to WL1v. If one of the word lines Wl11 to WL1v is changed to the active high voltage level, only the n-channel enhancement type field effect transistors with the relatively low threshold turn on, and conductive channels couple the associated digit lines to the ground voltage line. However, the n-channel enhancement type field effect transistor with the high threshold are turned off, and no conductive channel couples the associated digit line to the ground voltage line.

The precharging circuit 161 is implemented by a plurality of p-channel enhancement type charging transistors Qp31, Qp32, Qp33, ... and Qp3u coupled in parallel between a power voltage line and the digit lines DL11 to DL1u, and are responsive to a precharge control signal PC for charging the associated digit lines DL11 to DL1u to the power voltage level.

The sense amplifier unit 151 comprises a plurality of inverters IV11, IV12, IV13, ... and IV1u coupled at the input nodes thereof to the digit lines DL11 to DL1u and a plurality of clocked inverters CIV11, CIV12, CIV13, ... and CIV1u coupled at the input nodes thereof to the output nodes of the inverters IV11 to IV1u, respectively. The inverters IV11 to IV1u and the associated clocked inverters CIV11 to CIV1u form in combination a plurality of sense amplifier circuits. The clocked inverters CIV11 to CIV1u are selectively enabled with the column address decoded signal lines CL11 to CL1u, and the output nodes of the clocked inverters CIV11 to CIV1u are coupled with an input node of the NAND gate 17. The output node is shared between all of the sense amplifier units 151 to 15n, and the voltage level indicative of the accessed data bit is supplied from one of the clocked inverter enabled with the column address decoded signal line to the NAND gate 17.

Thus, the inverters IV11 to IV1u independently convert the voltage level on the associated digit lines DL11 to DL1u, respectively, and concurrently start the converting operations. In other words, the time delay due to the propagation of the power voltage to the output node N1 is never introduced into the inverting operations, and the selected sense amplifier unit rapidly completes the sensing operation. Moreover, the p-channel enhancement type charging transistors Qp31 to Qp3u independently charge the input nodes of the associated inverters IV11 to IV1u, and the input nodes of the inverters IV11 to IV1u reach the power voltage level without potential drop. For this reason, the potential level at the input nodes are exactly compared with the threshold level of the inverters IV11 to IV1u, and the malfunction does not take place.

Figure 5:
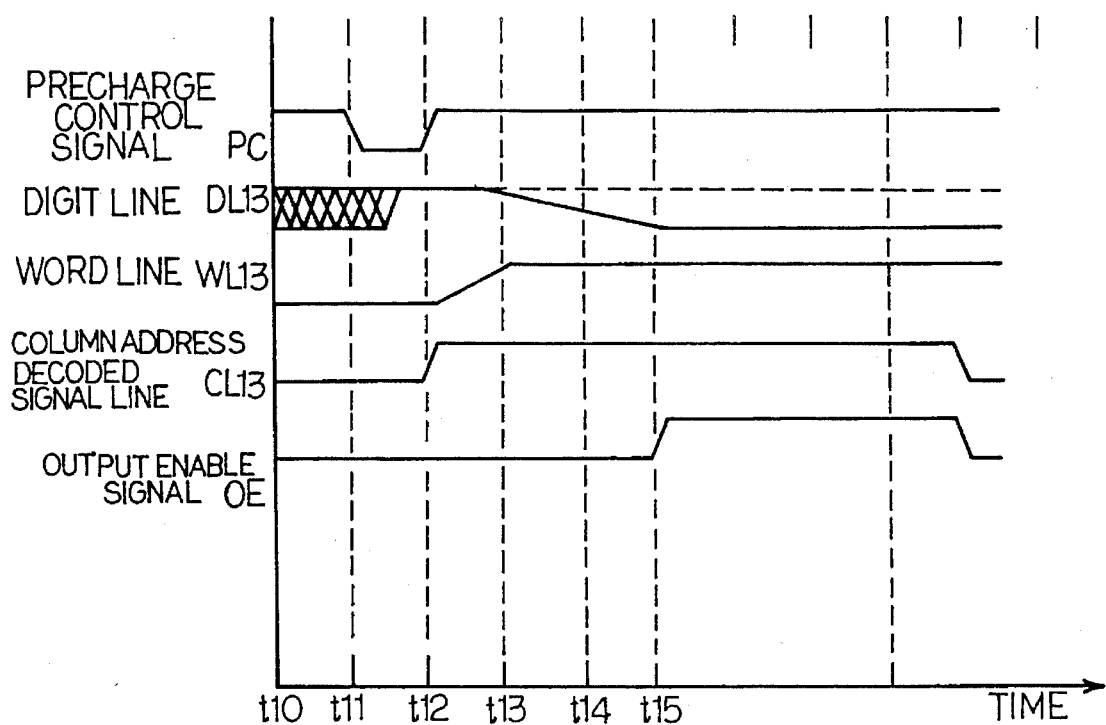
FIG. 5 is a timing chart showing a data access to a data bit stored in one of the memory cell blocks incorporated in the semiconductor read only memory device.

Description is hereinbelow made on an data access sequence with reference to FIG. 5 on the assumption that the external device accesses the data bit stored in the memory location M33 of the memory cell block 111. Firstly, the precharge control signal PC goes down to the active low voltage level at time t11, and the p-channel enhancement type charging transistors Qp31 to Qp3u turn on for charging the digit lines DL11 to DL1u to the power voltage level. The potential levels on the digit lines DL11 to DL1u are increased, and reach the power voltage level between time t11 and time t12. The precharge control signal PC returns to the inactive high voltage level at time t12, and the digit lines DL11 to DL1u are isolated from the power voltage line.

Subsequently, the word line WL13 starts to be elevated to the active high voltage level at time t12, and propagates the active high voltage level to the gate electrodes of associated the n-channel enhancement type field effect transistors. The memory locations M31, M32, ... and M3u are formed by the n-channel enhancement type field effect transistors with the relatively high threshold, and the associated digit lines DL11, DL12, ... and DL1u are not coupled to the ground voltage line. However, the memory location M33 provides the conductive channel from the associated digit line DL13 to the ground voltage line, and the digit line DL13 is discharged to the ground voltage line. As a result, the potential level on the digit line DL13 is decreased toward the ground voltage level.

The column address decoder 141 changes the column address decoded signal line CL13 to the active high voltage level at time t12, and the clocked inverter CIV13 is activated with the column address decoded signal line CL13. However, the other column address decoded signal lines CL11, CL12, ... and CL1u remain in the inactive low voltage level, and the clocked inverters CIV11, CIV12, ... and CIV1u can not respond to the potential levels at the input nodes thereof.

When the voltage level on the digit line DL13 becomes lower than the threshold level of the inverter IV13, the inverter IV13 changes the output node thereof to the high voltage level, and the activated clocked inverter CIV13 inverts the high voltage level at the output node of the inverter IV13 to the low voltage level. The low voltage level is relayed to the NAND gate 17, and the NAND gate 17 produces the output data signal Dout of the high voltage level indicative of the accessed data bit of logic "1" at time t15 in the presence of the output enable signal OE of active high voltage level. However, the other clocked inverters CIV11, CIV12, ... and CIV1u do not change the potential levels at the output nodes thereof.

If the external device is a microprocessor, every four clocks, i.e., from time t10 to time t14 form a machine cycle.

As will be appreciated from the foregoing description, the inverters IV11 to IV1u invert the potential levels on the digit lines independently from one another, and the only one activated clocked inverter transfers the potential level indicative of the accessed data bit to the output circuit 17. For this reason, the selected sense amplifier unit rapidly completes the operation without malfunction.

Second Embodiment

Figure 6:
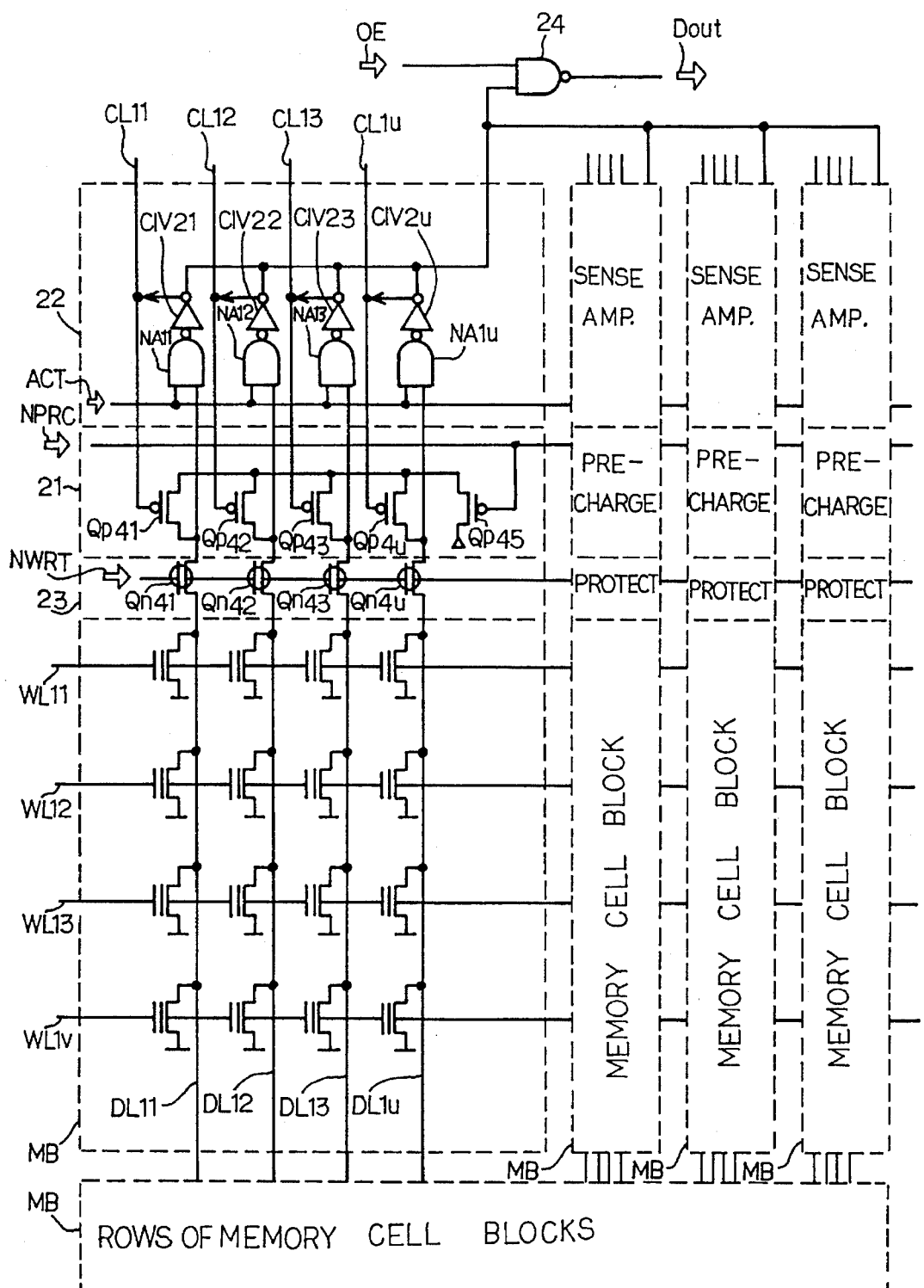
FIG. 6 is a circuit diagram showing the arrangement of another semiconductor read only memory device according to the present invention.
Figure 7:
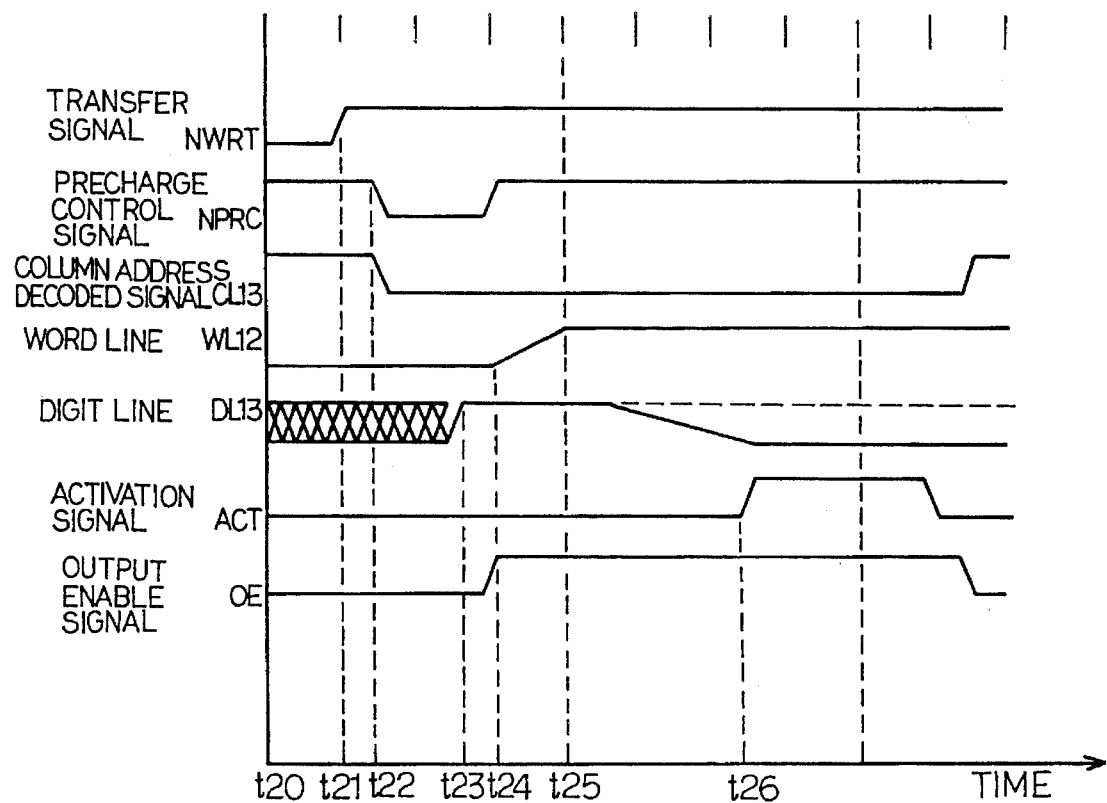
FIG. 7 is a timing chart showing a data access to a data bit stored in one of the memory cell blocks incorporated in the semiconductor read only memory device shown in FIG. 6.

Turning to FIG. 6 of the drawings, an electrically programmable read only memory device embodying the present invention includes a plurality of memory cell blocks MB each implemented by a plurality of floating gate type field effect transistors arranged in matrix. Though not shown in FIG. 6, a write-in circuit is provided in association with the plurality of memory cell blocks MB, and selectively supplies a write-in voltage to the drain nodes of the floating gate type field effect transistors for injecting hot electrons. If hot electrons are injected into the floating gate electrode of a floating gate type field effect transistor, the threshold thereof is increased over the active high voltage level on the associated word line, and the high threshold and the low threshold are corresponding to the two logic levels. In this instance, the floating gate type field effect transistors serve as memory locations, respectively.

All of the memory cell blocks MB are similar in circuit arrangement to one another, and the other circuits associated with the memory cell blocks MB are also similarly arranged. For this reason, description is made on one of the memory cell block MB and the associated circuits only.

The memory cell block MB at the upper corner of the leftmost column is associated with a plurality of digit lines DL11, DL12, DL13, ... and DL1u respectively associated with the columns of floating gate type field effect transistors, a plurality of word lines WL11, WL12, WL13, ... and WL1v respectively associated with the rows of floating gate type field effect transistors, a precharging circuit 21, a sense amplifier unit 22 and a protection circuit 23, and the sense amplifier unit 22 supplies a potential level indicative of an accessed data bit to an output circuit 24 implemented by a NAND gate 24.

The digit lines DL11 to DL1u are coupled with the drain nodes of the floating gate type field effect transistors of the associated column, and the word lines WL11 to WL1v are coupled to the control gate electrodes of the floating gate type field effect transistors of the associated rows. A source line is shared between all of the floating gate type field effect transistors, and floating gate type field effect transistors with the low threshold provide conductive channels between the associated digit lines and the source line when the associated word lines are changed to an active high voltage level.

The precharging circuit 21 comprises a plurality of p-channel enhancement type charging transistors Qp41, Qp42, Qp43 and Qp44 for the digit lines DL11 to DL1u and a p-channel enhancement type switching transistor Qp45 coupled between a power voltage line and the source nodes of the p-channel enhancement type charging transistors Qp41 to Qp44. Column address decoded signals CL11 to CL1u are supplied to the gate electrodes of the floating gate type field effect transistors Qp41 to Qp44, and a precharge control signal NPRC is supplied to the gate electrode of the p-channel enhancement type switching transistor Qp45.

With this arrangement, when the precharge control signal NWRT is changed to the active low voltage level, the p-channel enhancement type switching transistor Qp45 turns on, and the power voltage reach the source nodes of the p-channel enhancement type charging transistors Qp41 to Qp4u. The column address decoded signals causes the p-channel enhancement type charging transistors Qp41 to Qp4u to selectively turn on, and a selected p-channel enhancement type charging transistor charges the associated digit line to the power voltage level.

The sense amplifier unit 22 comprises a plurality of NAND gates NA11, NA12, NA13, ... and NA1u enabled with an activation signal ACT for rapidly discriminating the potential levels on the associated digit lines DL11 to DL1u and a plurality of clocked inverters CIV21, CIV22, CIV23, ... and CIV2u enabled with the column address decoded signals for inverting the potential levels at the output nodes of the NAND gates NA11 to NA1u. A clocked inverter enabled with the column address decoded signal supplies a potential level indicative of the accessed data bit to the output circuit 24.

The protection circuit comprises a plurality of n-channel enhancement type transfer transistors Qn41, Qn42, Qn43, ... and Qn4u with a lower threshold level than other n-channel enhancement type component transistors, and the n-channel enhancement type transfer transistors Qn41 to Qn4u are gated with a transfer signal NWRT. While the write-in voltage is selectively supplied to the drain nodes of the floating gate type field effect transistors, the n-channel enhancement type transfer transistors Qn41 to Qn4u prevent the p-channel enhancement type charging transistors Qp41 to Qp4u from the write-in voltage.

Assuming now that an external device accesses a data bit stored in the floating gate type field effect transistor with the low threshold located at the crossing point between the word line WL12 and the digit line DL13, the transfer signal NWRT is changed to the high voltage level at time t21, and the n-channel enhancement type transfer transistors Qn41 to Qn4u turn on so as to couple the p-channel enhancement type charging transistors Qp41 to Qp4u to the digit lines DL11 to DL1u. The external device is a microprocessor, and every four clock pulses form a machine cycle.

The precharge control signal NPRC goes down to the active low voltage level at time t22, and the p-channel enhancement type switching transistor Qp45 turns on so that the p-channel enhancement type charging transistors Qp41 to Qp4u become ready for precharging.

A column address decoder (now shown) responds to column address predecoded signals for changing the column address decoded signal CL13 to the active low voltage level at time t22, and the p-channel enhancement type charging transistor Qp43 turns on for charging the associated digit line DL13 to the power voltage level. However, the other p-channel enhancement type charging transistors Qp41, Qp42, ... and Qp4u are maintained in off-state. While the p-channel enhancement type charging transistor Qp43 is charging the digit line, the activation signal ACT is maintained in the inactive low voltage level, and the NAND gate NA13 is disabled. For this reason, even if the potential level on the digit line DL13 is passing through a critical zone, the component transistors of the NAND gate NA13 do not allow through-current to flow between the power voltage line and the ground voltage line.

The column address decoded signal CL13 further enables the clocked inverter CIV23. However, the output nodes of the clocked inverters CIV21 to CIV2u are maintained at the low voltage level, because the activation signal ACT remains in the low voltage level.

The digit line DL13 reaches the power voltage level at time t23, and a row address decoder (not shown) changes the word line WL12 to the active high voltage level at time t24. The floating gate type field effect transistor with the low threshold is increasing the channel conductance together with the potential level on the associated word line WL12. As a result, the potential level on the digit line DL13 is gradually decayed. The first machine cycle from time t20 to time t25 is finished, and the second machine cycle starts.

The activation signal ACT is changed to the active high voltage level at time t26, and the NAND gate NA23 becomes responsive to the potential level on the digit line DL13. The NAND gate NA13 yields the high voltage level at the output node thereof, and the clocked inverter CIV 13 supplies the low voltage level to the output circuit 24.

The output circuit 24 has been already enabled with the output enable signal OE, and produces an output data signal Dout indicative of the accessed data bit.

If a data bit stored in the floating gate type field effect transistor with the high threshold is accessed, the floating gate type field effect transistor keeps the power voltage level on the associated digit line, and the NAND gate and associated clocked inverter yield the potential levels opposite to the those in the above described read-out sequence.

The electrically programmable read only memory device according to the present invention shrinks the access time without malfunction, because the NAND gates NA11 to NA1u and the associated clocked inverters CIV21 to CIV2u are independent in the discrimination from one another. Moreover, only a selected digit line is precharged by the p-channel enhancement type charging transistor, and, for this reason, the selective precharging decreases the electrical consumption of the electrically programmable read only memory device.

Third Embodiment

Figure 8:
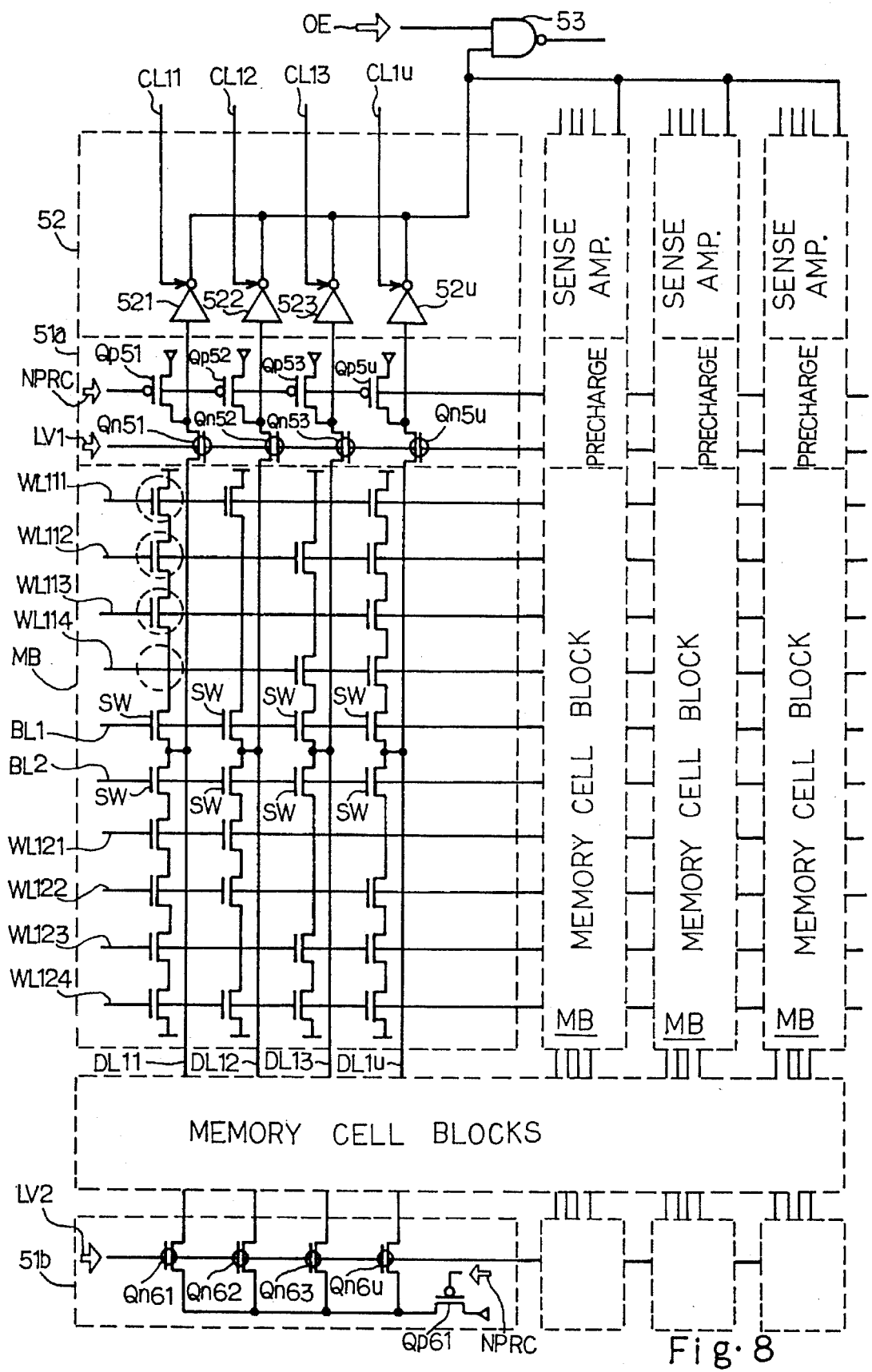
FIG. 8 is a circuit diagram showing the arrangement of yet another semiconductor read only memory device according to the present invention.

Turning to FIG. 8 of the drawings, another semiconductor read only memory device embodying the present invention comprises a plurality of memory cell blocks MB, and each of the memory cell blocks MB has a plurality of memory cell sub-blocks. Each memory cell sub-block is implemented by an n-channel enhancement type switching transistor SW and a plurality of memory cells forming in combination a NAND circuit, and an n-channel type field effect transistor with either high or low threshold serves as each memory cell. Although the n-channel type field effect transistors with the low threshold are not shown in FIG. 8, circles drawn by broken lines are indicative of the memory cells or memory locations incorporated in one of the memory cell sub-blocks. The n-channel type field effect transistors with the low threshold provide conductive channel at all times, and the n-channel type field effect transistors with the high threshold produce conductive channels when the gate electrodes thereof are changed to an active high voltage level.

Although the memory cell sub-blocks are not identical in arrangement with one another, description is hereinbelow made on two of the memory cell blocks on the upper side of the leftmost column and associated circuits only for the sake of simplicity.

Block lines BL1 and BL2 and a plurality of sets of word lines WL111/WL112/WL113/WL114, WL121/WL122/WL123/WL124 are provided for the memory cell blocks MB, and digit lines DL11, DL12, DL13, . . . and DL1u are associated with the memory cell blocks MB. Each of the memory cell sub-blocks is coupled between the associated digit line DL11/DL12/DL13/DL1u and a ground voltage line, and the n-channel enhancement type switching transistor SW is gated by the block line BL1/BL2. The n-channel type field effect transistors of each memory cell sub-block is gated by the associated word lines WL111/WL112/WL113/WL114 or WL121/WL122. WL123/WL124.

If the word lines WL111–WL114 or WL121 –WL124 allow all of the n-channel type field effect transistors to couple the n-channel type switching transistor in the on-state to the ground voltage line, the ground voltage line pulls down the associated digit line, and, for this reason, the memory cell sub-block forms the NAND circuit.

The memory cell blocks MB is associated with two precharging circuits 51a and 51b, a sense amplifier unit 52 and an output circuit 53. The precharging circuit 51a comprises a parallel combination of p-channel enhancement type charging transistors Qp51, Qp52, Qp53, . . . and Qp5u coupled between a power voltage line and the associated digit lines DL11 to DL1u and a parallel combination of n-channel enhancement type step-down transistors Qn51, Qn52, Qn53, . . . and Qn5u having respective channels inserted in the digit lines DL11 to DL1u. The n-channel enhancement type step-down transistors Qn51 to Qn5u have a threshold as low as 0.1 volt in this instance. The p-channel enhancement type charging transistors Qp51 to Qp5u are gated by a precharge control signal NPRC, and a transfer signal LV1 is supplied to the gate electrodes of the n-channel enhancement type step-down transistors Qn51 to Qn5u.

The other precharging circuit 51b comprises a p-channel enhancement type charging transistor Qp61 coupled between the power voltage line and a parallel combination of n-channel enhancement type step-down transistors Qn61 to Qn6u coupled between the drain node of the p-channel enhancement type charging transistor Qp61 and the digit lines DL11 to Dl1u. The n-channel enhancement type step-down transistors Qn61 to Qn6u are as low in threshold as the n-channel enhancement type step-down transistors Qn51 to Qn5u, and are gated by a transfer signal LV2. The precharge control signal NPRC is supplied to the gate electrode of the p-channel enhancement type charging transistor Qp61 for supplying the power voltage to the source nodes of the n-channel enhancement type step-down transistors Qn61 to Qn6u.

The sense amplifier unit 52 is implemented by a parallel combination of clocked inverters 521, 522, 523, . . . and 52u, and are selectively enabled with column address decoded signals CL11, CL12, CL13, . . . and CL1u. The input nodes of the clocked inverters 521 to 52u are coupled through the n-channel enhancement type step-down transistors Qn51 to Qn5u to the digit lines DL11 to Dl1u. Though not shown in FIG. 8, a column address decoder selectively changes the column address decoded signals CL11 to CL1u, and a block/row address decoder selectively drives the block lines BL1/BL2 and the word lines WL111–WL114 to WL121 –WL124.

Figure 9:
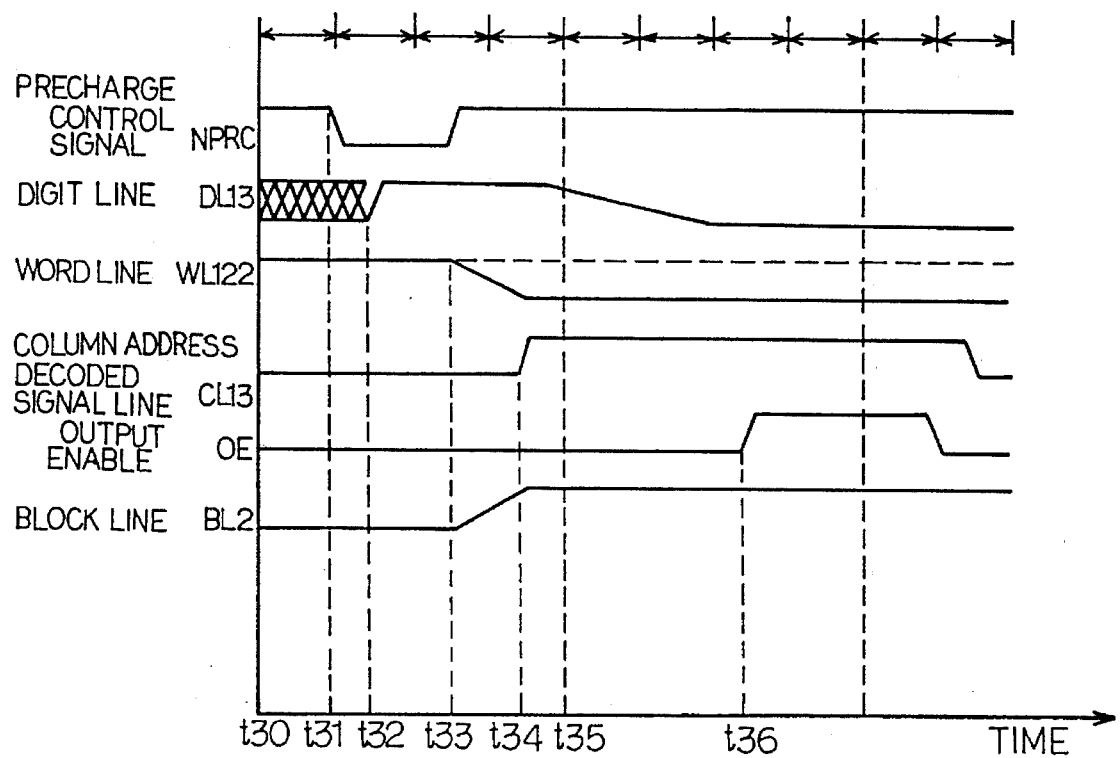
FIG. 9 is a timing chart showing a data access to a data bit stored in one of the memory cell blocks incorporated in the semiconductor read only memory device shown in FIG. 8.

FIG. 9 illustrates an access to a data bit stored in the memory cell at the crossing point between the word line WL122 and the digit line DL13. An external device is assumed to be a microprocessor, and every four clocks form a machine cycle. The transfer control signals LV1 and LV2 are maintained at 0.2 volt through the data access, and all of the word lines WL111 to WL114 and WL121 to WL124 are maintained at the high voltage level.

Firstly, the precharge control signal NPRC goes down to the active low voltage level at time t31. The p-channel enhancement type charging transistors Qp51 to Qp5u turn on so as to charge the input nodes of the clocked inverters 521 to 52u and the source nodes of the n-channel enhancement type step-down transistors Qn51 to Qn5u. The p-channel enhancement type charging transistor Qp61 also turns on, and supplies the power voltage level to the source nodes of the n-channel enhancement type step-down transistors Qn61 to Qn6u.

since the gate electrodes of the n-channel enhancement type step-down transistors Qn51 to Qn5u and Qn61 to Qn6u are maintained at 0.2 volt, the digit lines are charged to a certain level Vpc given as $$Vpc = V_{LV2} - Vto$$

where $V_{LV2}$ is the voltage level on the transfer control signals LV1 and VL2 and Vto is the threshold of the n-channel enhancement type step-down transistors Qn51 to Qn5u and Qn61 to Qn6u. The digit lines DL11 to DL1u start increasing the potential level at time t32. Upon completion of the precharging, the n-channel enhancement type switching transistors Qn51 to Qn5u turn off.

The selected block line BL2 starts to increase the potential level at time t33, and the selected word line WL122 goes down to the low voltage level at time t34. Other word lines are maintained at the high voltage level. The memory cell specified by the word line WL122 and the digit line DL13 provides the conductive channel at all times, and the digit line DL13 is discharged through the n-channel enhancement type switching transistor SW and the n-channel type field effect transistors to the ground voltage line. When the potential level on the digit line DL13 becomes lower than the transfer control signal LV1 than the threshold, the n-channel enhancement type step-down transistor Qn53 turns on, and the potential level at the input node of the clocked inverter 523 is lowered.

The column address decoded signal line CL13 is changed to the active high voltage level, and the clocked inverter 523 becomes responsive to the potential level at the input node thereof. Then, the clocked inverter 523 changes the output node thereof to the high voltage level. The output circuit 53 is enabled with the output enable signal OE at time t36, and yields the output data signal Dout indicative of the accessed data bit.

If the word line WL123 is changed to the low voltage level, the n-channel type field effect transistor with the high threshold turns off, and isolates the digit line DL13 from the ground voltage line. As a result, the n-channel enhancement type step-down transistor Qn52 is stably maintained in the off-state, and the clocked inverter 523 supplies the low voltage level to the output circuit 53.

Although particular embodiments of the present invention have been shown and described, it will be obvious to those skilled in the art that various changes and modifications may be made without departing from the spirit and scope of the present invention. For example, the semiconductor memory device according to the present invention may form a part of a large scale integration. Moreover, the memory locations of the semiconductor memory device are not limited to the field effect transistors with high and low thresholds and the floating gate type field effect transistors. Any kind of electrically programmable read only memory cells is available.

What is claimed is:

1. A semiconductor memory device fabricated on a single semiconductor chip, comprising:

a) a plurality of addressable memory locations respectively storing data bits readable in the form of potential level;

b) a first addressing system operative to select memory locations from said plurality of addressable memory locations for reading out the data bits therefrom;

c) a plurality of data propagation paths selectively coupled to said plurality of addressable memory cells, and propagating said data bits read out from said memory locations;

d) a second addressing system selectively energizing a plurality of selecting signal lines for selecting one of said data bits on said plurality of data propagation paths;

e) a plurality of sense amplifiers having an output node shared therebetween and respective data input nodes respectively coupled to said plurality of data propagation paths, respectively, and selectively activated with said plurality of selecting signal lines for discriminating the potential level of said one of said data bits independently from others of said plurality of sense amplifiers, an output signal indicative of said one of said data bits being produced at said output node shared between said plurality of sense amplifiers; and f) an output circuit for delivering said one of said data bits to the outside thereof.

2. The semiconductor memory device as set forth in claim 1, in which each of said memory locations is implemented by a field effect transistor with either high or low threshold.

3. The semiconductor memory device as set forth in claim 2, in which each of said plurality of sense amplifier circuits is implemented by a series combination of an inverter coupled with the associated data propagation path and a clocked inverter enabled with the associated selecting signal line, an output node of said clocked inverter being coupled to the input node of said output circuit.

4. The semiconductor memory device as set forth in claim 1, in which each of said memory locations is implemented by an electrically programmable read only memory cell.

5. The semiconductor memory device as set forth in claim 4, in which said electrically programmable read only memory cell is implemented by a floating gate type field effect transistor having a floating gate electrode for accumulating injected carrier.

6. The semiconductor memory device as set forth in claim 4, in which each of said plurality of sense amplifier circuits is implemented by a series combination of a logic gate and a clocked inverter, said logic gate being enabled with an activation signal and coupled with the associated data propagation path, said clocked inverter being enabled with the associated selecting signal line, and output node of said clocked inverter being coupled to the input node of said output circuit.

7. A semiconductor memory device fabricated on a single semiconductor chip, comprising:

a plurality of addressable memory locations respectively storing data bits readable in the form of potential level, each of said memory locations being implemented by an electrically programmable read only memory cell;

a first addressing system operative to select memory locations from said plurality of addressable memory locations for reading out the data bits therefrom;

a plurality of data propagation paths selectively coupled to said plurality of addressable memory cells, and propagating said data bits read out from said memory locations;

a second addressing system selectively energizing a plurality of selecting signal lines for selecting one of said data bits on said plurality of data propagation paths;

a plurality of sense amplifiers coupled to said plurality of data propagation paths, respectively, and selectively activated with said plurality of selecting signal lines for rapidly discriminating the potential level of said one of said data bits;

an output circuit for delivering said one of said data bits to the outside thereof, each of said sense amplifier circuits being implemented by a series combination of a logic gate and a clocked inverter, said logic gate being enabled with an activation signal and coupled with the associated data propagation path, said clocked inverter being enabled with the associated selecting signal line, and output node of said clocked inverter being coupled to the input node of said output circuit;

a precharging circuit enabled with a precharging signal and having a plurality of precharging transistors gated by said plurality of selecting signal lines for selectively charging said data propagation paths to a predetermined potential level; and a protection circuit having a plurality of transfer transistors having respective conduction paths inserted in said plurality of data propagation paths, respectively, said plurality of transfer transistors turning on while the data bit stored in one of said memory locations is being accessed, said plurality of transfer transistors turning off while the electrically programmable read only memory cells are being programmed.

8. The semiconductor memory device as set forth in claim 1, in which said plurality of memory locations are arranged into a plurality of memory sub-blocks each serving as a NAND circuit, each of said plurality of memory sub-blocks being coupled between one of said plurality of data propagation paths and a discharging line.

9. The semiconductor memory device as set forth in claim 8, in which each of said plurality of memory sub-blocks is implemented by a series combination of a switching transistor and a plurality of memory transistors selected by said first addressing system, each of said plurality of memory transistors providing one of a conductive path or a non-conductive path depending upon the data bit stored therein when said first addressing system selects said each of said plurality of memory transistors, said semiconductor memory device further comprising
a precharging circuit responsive to a precharge control signal for charging said plurality of data propagation paths to a precharging level, and having a plurality of charging transistors coupled to a source of precharging level and a plurality of step-down transistors coupled between said plurality of charging transistors and said plurality of data propagation paths, said precharge control signal concurrently gating said plurality of charging transistors, said plurality of step-down transistors keeping potential levels on said data propagation paths lower than said precharging level.

10. The semiconductor memory device as set forth in claim 8, in which each of said plurality of sense amplifiers is implemented by a clocked inverter enabled with one of said plurality of selecting signal lines.

* * * * *